United States Patent
Paik et al.

(10) Patent No.: US 11,216,733 B2
(45) Date of Patent: Jan. 4, 2022

(54) SELF-EVOLVING AGENT-BASED SIMULATION SYSTEM AND METHOD THEREOF

(71) Applicant: ELECTRONICS AND TELECOMMUNICATIONS RESEARCH INSTITUTE, Daejeon (KR)

(72) Inventors: Eui Hyun Paik, Daejeon (KR); Dong-Oh Kang, Daejeon (KR); Jang Won Bae, Daejeon (KR); Chun Hee Lee, Nonsan-si (KR); Joon Young Jung, Daejeon (KR); Ki Ho Kim, Daejeon (KR); Ok Gee Min, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 588 days.

(21) Appl. No.: 16/196,602

(22) Filed: Nov. 20, 2018

(65) Prior Publication Data
US 2019/0171942 A1 Jun. 6, 2019

(30) Foreign Application Priority Data

Nov. 20, 2017 (KR) ........................ 10-2017-0155029

(51) Int. Cl.
*G06N 3/12* (2006.01)
*G06N 5/04* (2006.01)
*G06F 30/20* (2020.01)

(52) U.S. Cl.
CPC ............ *G06N 3/126* (2013.01); *G06F 30/20* (2020.01); *G06N 5/043* (2013.01)

(58) Field of Classification Search
None
See application file for complete search history.

(56) References Cited

U.S. PATENT DOCUMENTS

| 10,048,658 B2 | 8/2018 | Kameda et al. | |
| 2006/0059113 A1* | 3/2006 | Kuznar | G06Q 40/04 706/45 |
| 2008/0215512 A1* | 9/2008 | Narzisi | G06N 3/126 706/13 |
| 2011/0106743 A1* | 5/2011 | Duchon | G06F 16/35 706/46 |

(Continued)

FOREIGN PATENT DOCUMENTS

| JP | WO2015/037165 | 3/2015 |
| KR | 10-1996-0013362 | 10/1996 |

(Continued)

*Primary Examiner* — Alan Chen
(74) *Attorney, Agent, or Firm* — Kile Park Reed & Houtteman PLLC (57) ABSTRACT

A self-evolving agent-based simulation system generates model evolution strategy for applying a difference between real-data and a simulation resulting value to a simulation model, and reconstructing components included in the simulation module using the model evolution strategy to evolve the simulation model when the difference between the real-data and the simulation resulting value of the agent-based simulation model does not satisfy a value in a predetermined error range.

9 Claims, 7 Drawing Sheets

(56) References Cited

U.S. PATENT DOCUMENTS

| | | | |
|---|---|---|---|
| 2012/0330639 A1* | 12/2012 | Bisdikian | G06F 8/355 |
| | | | 703/22 |
| 2014/0046633 A1 | 2/2014 | Chun | |
| 2014/0214393 A1 | 7/2014 | Kim et al. | |
| 2015/0242798 A1* | 8/2015 | Zou | G06Q 10/063114 |
| | | | 705/7.15 |
| 2017/0147722 A1* | 5/2017 | Greenwood | G16B 5/20 |
| 2017/0213150 A1* | 7/2017 | Arel | G06N 3/0427 |
| 2019/0213599 A1* | 7/2019 | Sullivan | G06Q 30/00 |

FOREIGN PATENT DOCUMENTS

| KR | 10-2016-0014174 | 2/2016 |
|---|---|---|
| KR | 10-2016-0084026 | 7/2016 |

\* cited by examiner

SELF-EVOLVING AGENT-BASED SIMULATION SYSTEM AND METHOD THEREOF

CROSS-REFERENCE TO RELATED APPLICATION

This application claims priority to and the benefit of Korean Patent Application No. 10-2017-0155029 filed in the Korean Intellectual Property Office on Nov. 20, 2017, the entire contents of which are incorporated herein by reference.

BACKGROUND OF THE INVENTION

(a) Field of the Invention

The present invention relates to a self-evolving agent-based simulation system and method, and more particularly, to a self-evolving agent-based simulation system and method for overcoming a problem in terms of degraded reliability of predicting the future over time and continuously predicting the future with high accuracy using an agent-based micro simulation that is used to recognize a change in complex and various realities and predict the future.

(b) Description of the Related Art

To analyze modern complex and diverse economic and social phenomena and predict the future, experiments on the real world are costly and almost impossible. Accordingly, when the real world is analyzed to predict the future using a simulation method for modeling the real world in an abstract model, costs may be remarkably reduced.

However, the simulation result has an error from reality, and when the simulation is performed for a long time, errors are accumulated, and thus, the future prediction result may be different from reality.

In general, an agent-based simulation system includes agents, interactions, and an environment. A conventional agent-based simulation method is a scheme of modeling system components and interactions between the system components, executing the modeling in computing nodes, and analyzing and predicting the execution result.

However, since a surrounding environment is continuously changed, errors are accumulated over time with respect to a simulation model made once, and thus, there is a problem in that the capability of the simulation model of predicting the future is inevitably degraded over time.

SUMMARY OF THE INVENTION

An exemplary embodiment of the present invention provides a self-evolving agent-based simulation system and method for overcoming a problem in terms of degraded capability of predicting the future over time and continuously predicting the future with high accuracy.

Another embodiment of the present invention provides a self-evolving simulation method of a self-evolving agent-based simulation system.

According to an embodiment of the present invention, a self-evolving method of an agent-based simulation system includes outputting a simulation resulting value by executing an agent-based simulation model, when a difference between real-data and a simulation resulting value of the simulation model is outside a predetermined error range, generating model evolution strategy for applying the difference between the real-data and the simulation resulting value to the simulation model, and evolving the simulation model by reconstructing components included in the simulation model using the model evolution strategy.

The method may further include adjusting the number of agents that participate in the simulation model prior to execution of the simulation model.

The adjusting of the number of the agents may include grouping agents with similar characteristics to one agent according to a predetermined reference, and indicating density to the grouped agent.

The method may further include updating the predetermined error range in consideration of tendency and conditions of data.

The generating of the model evolution strategy may include generating the model evolution strategy using at least one of the change results between the real-data and the simulation resulting value, a simulation model structure, a change history, and the simulation resulting value.

According to another embodiment of the present invention, a self-evolving agent-based simulation system may be provided. The self-evolving agent-based simulation system may include a simulation model execution unit for executing an agent-based simulation model and outputting a simulation resulting value, a change recognition unit for checking a difference between real-data and the simulation resulting value, and a model self-evolving unit for evolving the simulation model by applying the difference when the difference is outside a predetermined error range.

The self-evolving agent-based simulation system may further include a model evolution strategy generator for generating model evolution strategy based on the difference, wherein the model self-evolving unit reconstructs components of the simulation model based on the model evolution strategy.

The change recognition unit may include a complex domain data analyzer for converting the real-data into a form in which the real-data is comparable with the simulation resulting value, a change recognition processor for recognizing a difference between the real-data and the simulation resulting value at the same time, and a data tendency analyzer for generating a change recognition results according to the difference when the difference is outside the error range.

The model self-evolving unit may generate the model evolution strategy using at least one of the change recognition results, a simulation model structure, a change history, and the simulation resulting value.

The self-evolving agent-based simulation system may further include a simulation preparation processor for adjusting the number of agents that participate in the simulation model prior to execution of the simulation model.

The simulation preparation processor may include an agent grouping unit for grouping agents having similar characteristics to one agent according to a predetermined reference and indicating density to the grouped agents.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification, unless explicitly described to the contrary, the word "comprise" and variations such as "comprises" or "comprising", will be understood to imply the inclusion of stated elements but not the exclusion of any other elements.

Hereinafter, a self-evolving agent-based simulation system and method according to an exemplary embodiment of the present invention are described with reference to the accompanying drawings.

Figure 1:
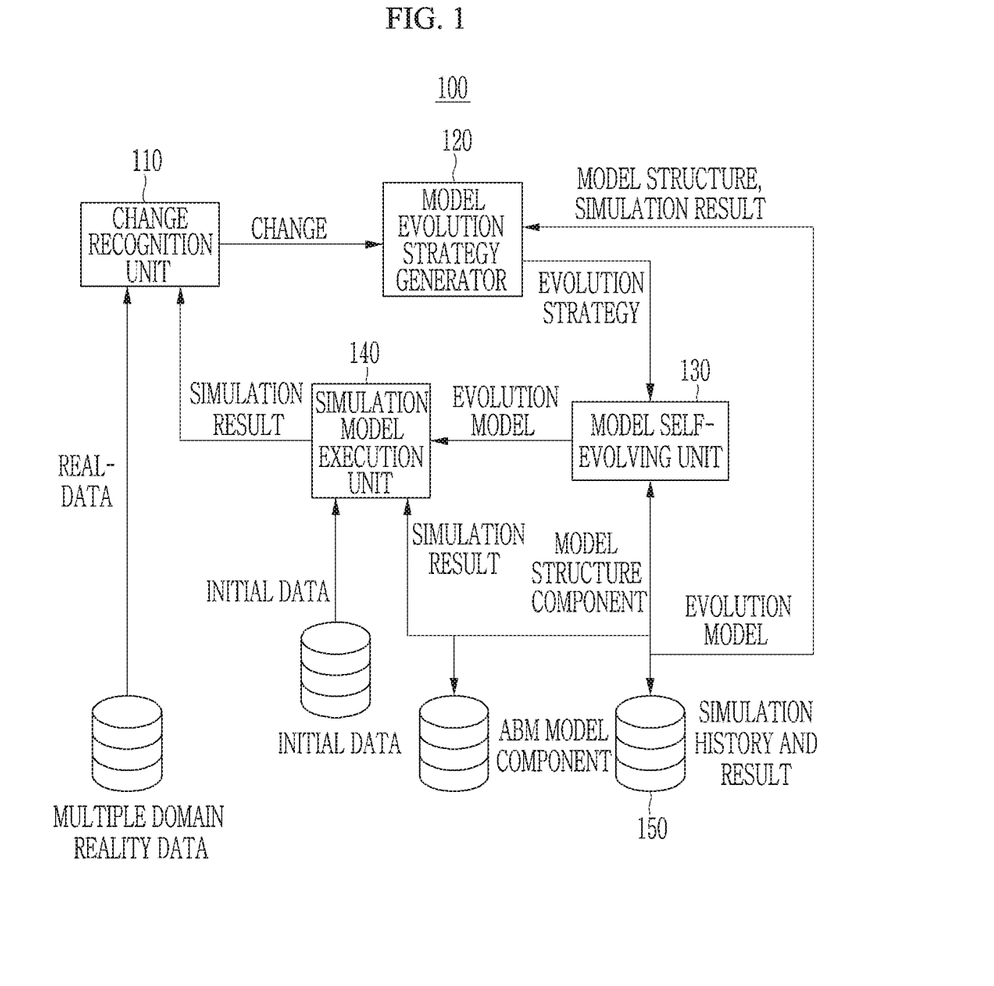
FIG. 1 is a diagram showing a self-evolving simulation system according to an exemplary embodiment of the present invention.

FIG. 1 is a diagram showing a self-evolving simulation system according to an exemplary embodiment of the present invention.

Referring to FIG. 1, a self-evolving simulation system 100 may include a change recognition unit 110, a model evolution strategy generator 120, a model self-evolving unit 130, and a simulation model execution unit 140. The self-evolving simulation system 100 may further include a simulation result storage unit 150. The self-evolving simulation system 100 may perform a function of each of the change recognition unit 110, the model evolution strategy generator 120, the model self-evolving unit 130, and the simulation model execution unit 140 through at least one processor (not shown). At least one processor may refer to a central processing unit (CPU), a graphics processing unit (GPU), or a dedicated processor for performing a method according to exemplary embodiments of the present invention.

The change recognition unit 110 may recognize a difference between a predicted value of an agent-based micro simulation and real-data, when there is a difference, the change recognition results may be transmitted to the model evolution strategy generator 120.

Upon receiving the change recognition results from the change recognition unit 110, the model evolution strategy generator 120 may generate a model evolution strategy to improve capability of predicting the future based on the recognized change. The model evolution strategy generator 120 may generate model evolution strategy based on accumulated history information. For example, the model evolution strategy generator 120 may receive history information such as a simulation model structure, an input data set, and a simulation result from the simulation result storage unit 150 and generate the model evolution strategy.

The model self-evolving unit 130 may reconstruct components of the simulation model to evolve the model by the model evolution strategy. The evolved model may be transmitted to the simulation model execution unit 140.

The simulation model execution unit 140 may execute the evolved model to output the simulation result. The simulation model execution unit 140 may execute the simulation module using initial data when the simulation is first started and may output the simulation result. When the simulation model execution unit 140 executes the simulation model, a plurality of agents may be generated and simulation may be executed via an interaction between the agents.

The simulation result storage unit 150 may store and manage information such as a simulation history, simulation result, and model evolution strategy.

Figure 2:
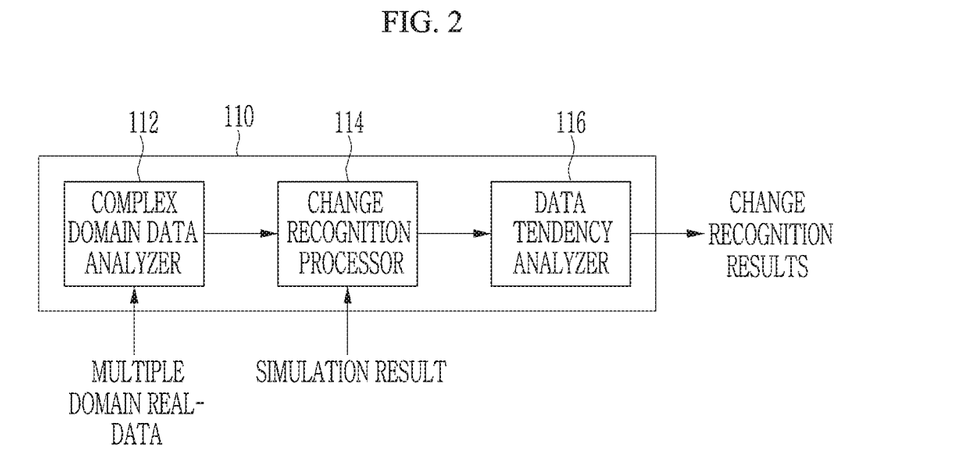
FIG. 2 is a diagram showing the change recognition unit shown in FIG. 1.

FIG. 2 is a diagram showing the change recognition unit shown in FIG. 1.

Referring to FIG. 2, the change recognition unit 110 may include a complex domain data analyzer 112, a change recognition processor 114, and a data tendency analyzer 116.

The complex domain data analyzer 112 may change multiple domain real-data measured in reality to data in the form for comparison with the simulation result. When the data measured in reality is capable of being directly compared with the simulation result, the data measured in reality may be used without change of the data.

The change recognition processor 114 may compare the data measured in reality corresponding to time series data and the simulation result to recognize a difference between the real-data and the simulation result. That is, the change recognition processor 114 may compare a value of data that is changed for each time zone predicted by the self-evolving simulation system 100 and a value of data measured at a corresponding time to recognize whether there is a difference therebetween.

The data tendency analyzer 116 may update a predetermined error range in consideration of tendency and condition of data and may determine whether the difference satisfies a value in the predetermined error range. When the difference does not satisfy the value in the predetermined error range, the change recognition results may be generated and may be transmitted to the model evolution strategy generator 120. The change recognition results may represent whether there is a change, and when there is a change, the change recognition results may include information on a difference between real-data and the simulation result.

Figure 3:
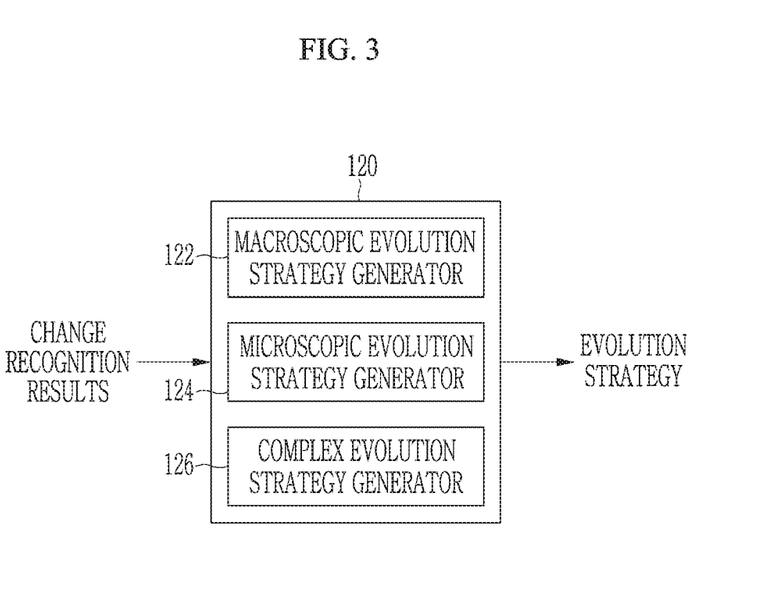
FIG. 3 is a diagram showing the model evolution strategy generator shown in FIG. 1.

FIG. 3 is a diagram showing the model evolution strategy generator shown in FIG. 1.

Referring to FIG. 3, the model evolution strategy generator 120 may include a macroscopic evolution strategy generator 122, a microscopic evolution strategy generator 124, and a complex evolution strategy generator 126.

The macroscopic evolution strategy generator 122 may generate macroscopic evolution strategy for applying a macroscopic change to the simulation model.

The microscopic evolution strategy generator 124 may generate microscopic evolution strategy for applying a microscopic change to the simulation model.

The macroscopic change may refer to a change in social current state. For example, in housing markets, whether housing markets are currently in an economic boom or economic depression and whether a specific zone is a speculative zone or not, may be recognized through an index such as house trading volume and housing transaction value. In housing markets, economic changes (boom/depression) and changes in zone characteristics (speculative/non-speculative zone) correspond to macroscopic change.

On the other hand, microscopic changes refer to changes in behavior of members of society. For example, agents that deal with houses in housing markets may have different methods of selling houses (time points and costs for selling houses in housing markets) and different methods of buying houses (time points and costs for buying houses in housing markets), and these methods may also be changed depending on a change in housing markets. In housing markets, a change in business behavior of an agent may correspond to a microscopic change.

The complex evolution strategy generator 126 may generate complex evolution strategy for applying a complex change in consideration of the macroscopic change and the microscopic change to the simulation model.

Based on the change recognition results, the simulation model structure, the change history, and the simulation result transmitted from the change recognition unit 110, all of the macroscopic evolution strategy generator 122, the microscopic evolution strategy generator 124, and the complex evolution strategy generator 126 may be operated to generate evolution strategy.

Figure 4:
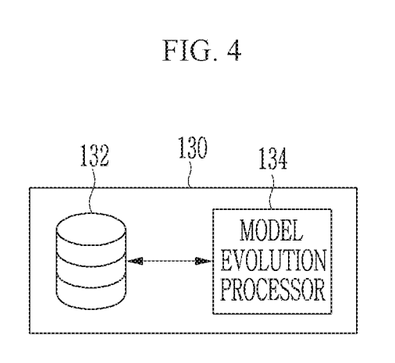
FIG. 4 is a diagram showing the model self-evolving unit shown in FIG. 1.

FIG. 4 is a diagram showing the model self-evolving unit shown in FIG. 1.

Referring to FIG. 4, the model self-evolving unit 130 may include an agent-based model (ABM) component storage 132 and a model evolution processor 134.

The ABM component storage 132 may store and manage ABM components of a simulation model. That is, the ABM component storage 132 may store and manage a behavior component, an interaction component, and a model structure component of the simulation model.

The model evolution processor 134 may evolve a current simulation model using the evolution strategy generated by the model evolution strategy generator 120. The evolved simulation model may be executed by the simulation model execution unit 140. A behavior component, an interaction component, and a model structure component of the evolved simulation model may be stored in the ABM component storage 132 and information such as evolution strategy may be stored in the simulation result storage unit 150.

Figure 5:
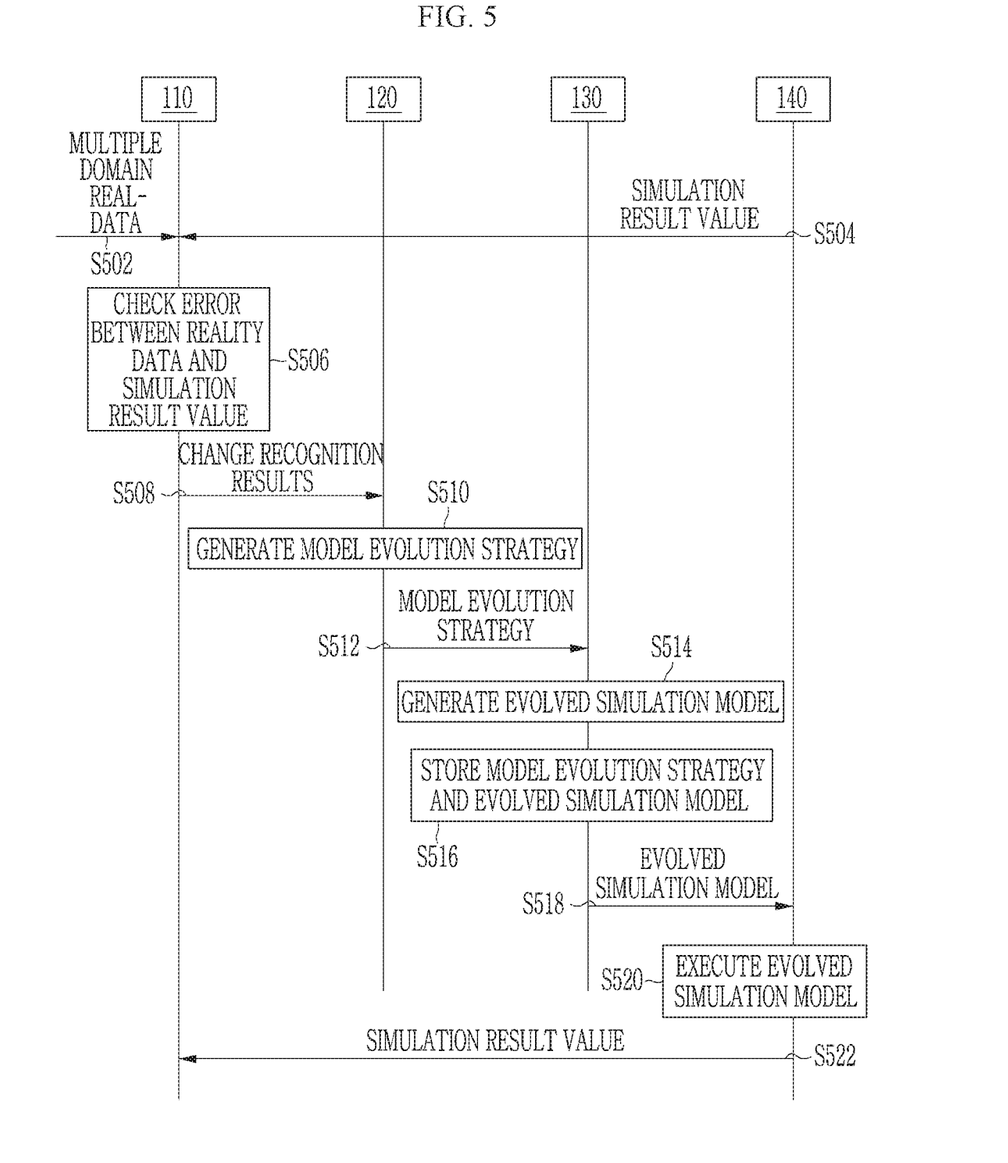
FIG. 5 is a diagram for explanation of a self-evolving simulation method according to an exemplary embodiment of the present invention.

FIG. 5 is a diagram for explanation of a self-evolving simulation method according to an exemplary embodiment of the present invention.

Referring to FIG. 5, when the simulation is started, the change recognition unit 110 may receive multiple domain real-data and a time series-based simulation resulting value from the simulation model execution unit 140 as an input value (S502 and S504).

The change recognition unit 110 may check whether an error is present between real-data and the simulation resulting value (S506), and when the error is present, the change recognition unit 110 may transmit the change recognition results to the model evolution strategy generator 120 (S508).

Upon receiving the change recognition results from the change recognition unit 110, the model evolution strategy generator 120 may generate the model evolution strategy for applying the macroscopic change and/or the microscopic change between the real-data and the simulation resulting value (S510) and may transmit the model evolution strategy to the model self-evolving unit 130 (S512).

The model self-evolving unit 130 may reconstruct the behavior component, the interaction component, and the model structure component of the simulation model stored in the ABM component storage 132 and generate an evolved simulation model using the model evolution strategy (S514), may store the evolved simulation model in the ABM component storage 132, and may store evolution strategy applied to the evolved simulation model in the simulation result storage unit 150 (S516). The evolved simulation model may be transmitted to the simulation model execution unit 140 (S518).

The simulation model execution unit 140 may execute the evolved simulation model (S520) and may transmit the simulation resulting value to the change recognition unit 110 (S522).

In addition, operations S504 to S522 may be repeatedly performed to continuously evolve the simulation model until the difference between the real-data and the simulation resulting value satisfies a value in a predetermined error range, and when the difference satisfies the value in the error range, an evolution operation of the simulation model may be terminated.

As such, the self-evolving simulation method according to an exemplary embodiment of the present invention may continuously compare the real-data and the simulation resulting value until the simulation is terminated, and when a change is recognized, the simulation model may be self-evolved by executing operations S508 to S516, and thus, a self-evolving simulation for improving capability of predicting the future may be realized.

Figure 6:
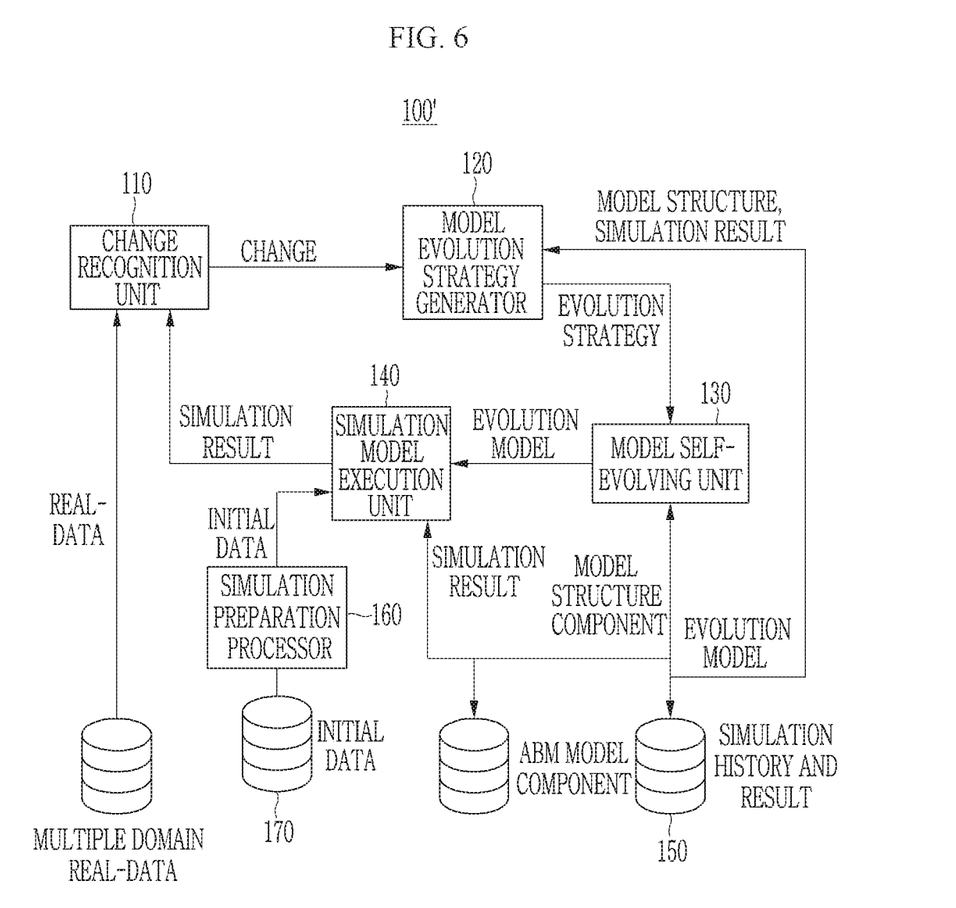
FIG. 6 is a diagram showing a self-evolving simulation system according to another exemplary embodiment of the present invention.

FIG. 6 is a diagram showing a self-evolving simulation system according to another exemplary embodiment of the present invention.

Referring to FIG. 6, a self-evolving simulation system 100' may further include a simulation preparation processor 160 and an initial data storage unit 170, compared with the self-evolving simulation system 100 of FIG. 1.

The simulation preparation processor 160 may prepare the number of agent that intends to participate in simulation and model evolution and agent initial data prior to execution of the simulation. A total execution time of the simulation may be determined according to the specification of a computer to be executed, the number of agents that participate in the simulation, the complexity of the simulation model, and a time taken to self-evolve the model. Accordingly, when the number of agents that participate in the simulation is high, it may be required to adjust the number of agents that participate in the simulation. To adjust the number of agents that participate in the simulation, the simulation preparation processor 160 may compare the characteristics of the agents that participate in the simulation, may replace agents having the same characteristics with one agent, and then, may record the number of agents having the same characteristics in a field of density of agent attributes. When this process is performed, a plurality of agents having the same characteristic may be replaced with one agent, and thus, the number of agents that participate in the simulation may be reduced. After this process is performed, the reduced agents may be provided to the simulation model execution unit 140.

When the number of agents that participate in the simulation is low or there is no problem in terms of a simulation execution time because a supported computer system provides sufficient performance, a function of the simulation preparation processor 160 may be omitted. When simulation performance is problematic in that the number of agents that participate in the simulation is high, if a function of the initial data preparation unit 160 is applied, a large scale of agent simulation is possible in a limited computer system.

The initial data storage unit 170 may store initial data for simulation.

Figure 7:
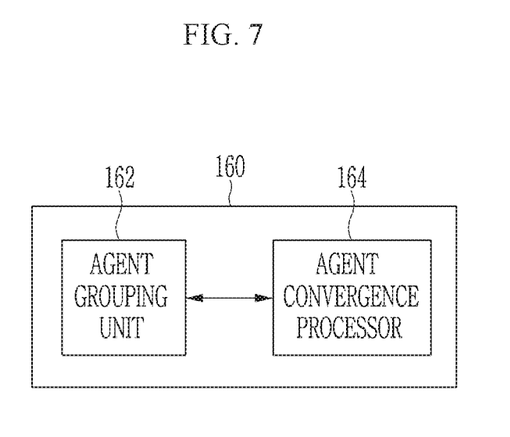
FIG. 7 is a diagram showing the simulation preparation processor shown in FIG. 6.

FIG. 7 is a diagram showing the simulation preparation processor shown in FIG. 6.

Referring to FIG. 7, the simulation preparation processor 160 may include an agent grouping unit 162 for grouping agents having similar characteristics to adjust a scale of agents that participate in the simulation and indicating the density of the grouped agents, and an agent convergence processor 164 for convergence of the agents grouped by the agent grouping unit 162 and an initial agent.

Hereinafter, an example to which the self-evolving simulation systems 100 and 100' according to an exemplary embodiment of the present invention is applied will be described.

First, a senior citizen welfare simulation using the self-evolving simulation system 100' will be exemplified.

Table 1 shows a scenario of the senior citizen welfare simulation.

TABLE 1

| | |
|---|---|
| Subject of senior citizen welfare simulation | Government or Local government |
| Object of senior citizen welfare simulation | Establishment of effective senior citizen welfare policy through prediction of future economic activity and poverty change of senior citizen<br>Prediction of influence of change in senior citizen welfare policy of government on economic activity status/poverty of senior citizen |
| Input data | initial data: initial elderly population data (about 6,000 households, 2014, Korean welfare panel research data)<br>Simulation validation data: economic activity rate of senior citizen, basic pension reception rate, poverty rate (Statistics Korea, 2014-current)<br>Government policy data: related to economic activity of senior citizen: participant number/budget of senior citizen employment project<br>related to basic pension policy: basic deduction amount, determination reference value, and income and asset conversion rate |
| simulation output data | senior citizen welfare simulation result:<br>labor force participation rate of senior citizen, basic pension reception rate, poverty rate of senior citizen (self-evolving check point)<br>Employment rate of senior citizen, public transfer income ratio<br>characteristic change data for each senior citizen (January, 2014-current)<br>Sex/region/age/marital status/educational level distribution of senior citizen<br>Economic activity/employment/basic pension reception/poverty for each senior citizen |

Execution and self-evolving procedure of a senior citizen welfare simulation of the self-evolving simulation system 100' according to an exemplary embodiment of the present invention will be described below.

The simulation initial data may be stored in the initial data storage unit 170, and simulation validation data for validation of the simulation result and government policy data may be provided to the change recognition unit 110 as real-data. The simulation initial data may be initial elder population data that participates in the simulation, and the simulation model execution unit 140 may generate an initial elderly agent to execute the simulation using the data when the simulation is started. The simulation validation data may include a labor force participation rate of senior citizen, a basic pension reception rate, and poverty rate data, and the government policy data may include participant number/budget of senior citizen employment project, a basic deduction amount, a determination reference value, income and asset conversion rate, and the like.

The simulation preparation processor 160 may determine whether agents that participate in the simulation are grouped and executed or are executed without grouping in consideration of the number of agents that participate in the simulation and performance of a computer system to be used in the simulation. For example, about 6000 agents do not significantly affect the performance of the computer system, and thus, a function of the simulation preparation processor 160 may be omitted. When several hundreds of thousands of agents or more perform a simulation on a single CPU, a simulation execution time is geometrically increased, and thus, a function of a simulation preparation processor is required. When the simulation preparation processor 160 groups agents that participate in a simulation, similar agents may be generated as one grouped agent using information on similarity (age, income, is region, etc.) of agents. In this case, density information may be indicated on the grouped agents. The density information may indicate the number of the same agent and may be used to analyze the future simulation result.

The simulation model execution unit 140 may execute the senior citizen welfare simulation model using initial data of elderly population data (Korean welfare panel research data, January, 2014) that is 6000, for example, on January, 2014, may transmit the simulation result (labor force participation rate of senior citizen, basic pension reception rate, poverty rate of senior citizen) to the change recognition unit 110 every month, and may output the remaining execution result to the simulation result storage unit 150. The first data transmitted to the change recognition unit 110 by the simulation model execution unit 140 may be information on labor force participation rate of senior citizen, basic pension reception rate, and poverty rate of senior citizen on February 2014. The remaining execution result may be information except for information to be provided to the change recognition unit 110 from the simulation output data, and may refer to sex/region/age/marital status/educational level distribution of senior citizen and economic activity/employment/basic pension reception/poverty index for each senior citizen except for the labor force participation rate of senior citizen, basic pension reception rate, and poverty rate of senior citizen from the simulation output data of Table 1.

The change recognition unit 110 may compare the simulation result (labor force participation rate of senior citizen, basic pension reception rate, and poverty rate of senior citizen) with real-data released by Statistics Korea to check whether an error is present in an allowable range. The allowable range of the error may be determined by a user, and for example, the allowable range of the error may be set to 5% or 10%. The change recognition unit 110 may transmit a message indicating that a simulation is to be continuously executed, to the simulation model execution unit 140, when the error is within the allowable range. In this case, there is no problem in accuracy of prediction of a simulation model, and thus, the simulation model may be used without being evolved. When the error is not in the allowable range, capability of predicting the simulation model may be degraded and it may be required to evolve the model. In this case, to indicate evolution of the simulation model, the change recognition unit 110 may transmit the change recognition results (error information of labor force participation rate of senior citizen, basic pension reception rate, and poverty rate of senior citizen information) to the model evolution strategy generator 120. Then, operations S510 to S518 of FIG. 5 may be sequentially performed to generate a new simulation model and the new simulation model may be provided to the simulation model execution unit 140. In detail, the model evolution strategy generator 120 may check a difference degree between reality and capability of predicting future of a current senior citizen welfare model using the change recognition results (error information of labor force participation rate of senior citizen, basic pension reception rate, and poverty rate of senior citizen information) received from the change recognition unit 110, may generate model evolution strategy, and then, may transmit the model evolution strategy to the model self-evolving unit 130 to apply the error between labor force participation rate of senior citizen, basic pension reception rate, and poverty rate of senior citizen information, which are actually measured, and resulting value of the labor force participation rate of senior citizen, basic pension reception rate, and poverty rate of senior citizen, which are predicted in the simulation, to the simulation model. The model self-evolving unit 130 may generate a new strategy model using the received model evolution strategy and the ABM model components. The newly generated evolution model and the applied evolution strategy may be stored in the ABM component storage 132 and the evolved model information may be transmitted to the simulation model execution unit 140.

Then, upon receiving the evolved model information from the model self-evolving unit 130, the simulation model execution unit 140 may execute the newly evolved model.

As such, the continuously changed real-data may be provided to the change recognition unit 110, error between the real-data and the simulation result of the simulation model execution unit 140 may be continuously applied to the simulation model, and it may be possible to continuously predict the future with high accuracy.

As another example, a housing simulation using the self-evolving simulation systems 100 and 100' will be exemplified.

A scenario of a housing simulation is shown in Table 2 below.

TABLE 2

| | |
|---|---|
| Subject of housing simulation | Government or Local government |
| Object of housing simulation | Establishment of effective housing policy for analysis and prediction of change in future housing markets<br>Prediction of change in housing markets depending on change in government policy |
| Input data | initial data: initial housing data (7,000 households, Statistics Korea, household financial welfare data, 2012-2017)<br>Simulation validation data: house trading volume, Housing price index (Ministry of Land, Infrastructure and Transport, housing actual transaction data January 2012-Current)<br>Government policy data: LTV, DTI, housing tax rate data (transfer income tax, income tax, and acquisition and registration tax)<br>macroscopic data: employment rate |
| simulation output data | housing markets change result:<br>house trading volume, housing price index (self-evolving check point)<br>House style, housing type, transaction success rate, vacancy rate, household debt<br>Characteristic change data for each house (January 2012-Current, characteristics for each house every month)<br>Gender distribution of householder, Age distribution of householder, Number distribution of household members, Distribution of Marital Status, and Education level of householder<br>House living style, house type, market price of real estate across income quintiles/lease/security deposit/total asset change/financial asset change/debt change |

An execution and self-evolving procedure of a hose simulation of a self-evolving simulation system according to an exemplary embodiment of the present invention will be described below. Simulation initial data may be stored in the initial data storage unit 170, and simulation validation data for validating the simulation result and government policy data may correspond to real-data. The simulation initial data may include initial housing data. The simulation validation data may include house real transaction data, and the house real transaction data may use house real transaction data from Ministry of Land. The government policy data may include loan to value ratio (LTV), debt-to-income ratio (DTI), a house tax ratio data (capital gain tax, income tax, and acquisition and registration tax), and the like.

The simulation preparation processor 160 may whether agents are grouped that participate in the simulation to execute the simulation or the simulation is executed without change in consideration of the number of the agents that participate in the simulation and performance of a computer system used in the simulation.

The simulation model execution unit 140 may execute a house simulation model (H-Model: Housing Model) using data (household financial welfare data 2012.1) of 7,000 houses, for example, on January 2012 as initial data, may transmit the simulation result (house price indexes, house trading volume information) to the change recognition unit 110 every month, and may transmit the remaining execution result to the simulation result storage unit 150. First data transmitted to the simulation model execution unit 140 may be information on house price indexes and house trading volume on February 2012.

The change recognition unit 110 may compare the simulation result (house price indexes, house trading volume information) with real-data released by Ministry of Land to check whether the error is in the allowable range. When the error is within the allowable range, the change recognition unit 110 may transmit a message indicating that a simulation is to be continuously executed, to the simulation model execution unit 140, and when the error is outside the allowable range, the change recognition results (error information of housing price index and house trading volume information) may be transmitted to the model evolution strategy generator 120 to indicate simulation model evolution. In this case, operations S510 to S518 of FIG. 5 may be sequentially performed to generate a new simulation model and the new simulation model may be provided to the simulation model execution unit 140. In detail, the model evolution strategy generator 120 may check a difference degree between reality and capability of predicting future of a current housing model using the changed recognition result (error information of housing price index and house trading volume information) received from the change recognition unit 110, may generate model evolution strategy, and then, may transmit the model evolution strategy to the model self-evolving unit 130 to apply the error between actually measured housing price index/house trading volume information and housing price index/house trading volume result that are predicted in the simulation to the simulation model. The model self-evolving unit 130 may generate a new evolution model using the received model evolution strategy and ABM model components. The newly generated evolution model and the applied evolution strategy may be stored in the ABM model component storage 132 and the evolved model information may be transmitted to the simulation model execution unit 140.

Then, upon receiving the evolved model information from the model self-evolving unit 130, the simulation model execution unit 140 may execute the newly evolved model.

As such, in the case of a housing simulation of a self-evolving simulation system, the continuously changed real-data may be provided to the change recognition unit 110, error between the real-data and the simulation result of the simulation model execution unit 140 may be continuously applied to the simulation model, and it may be possible to continuously predict the future with high accuracy.

According to an exemplary embodiment of the present invention, a difference between rapidly changed real-data and a simulation may be recognized, and the recognized difference may be continuously applied to the simulation model to self-evolve the simulation model, thereby improving the predicting capability of the simulation.

In particular, a rapidly changed current data may be continuously applied is to a simulation model to save high costs and time taken to change the model to correct an error of the simulation model and to advantageously and continuously obtain prediction result with high accuracy.

An exemplary embodiment of the present invention may be embodied through a program for executing a function corresponding to the construction of the exemplary embodiment of the present invention or a recording medium for recording the program therein as well as through the aforementioned apparatus and/or method, and the embodiments may be easily realized by those of ordinary skill in the art from the above description of the exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A self-evolving simulation method of agent-based simulation system, the method comprising:
    outputting a simulation resulting value by executing an agent-based simulation model;
    when a difference between real-data and the simulation resulting value of the simulation model is outside a predetermined error range, generating a model evolution strategy for applying the difference between the real-data and the simulation resulting value to the simulation model;
    evolving the simulation model by reconstructing components included in the simulation model using the model evolution strategy; and
    adjusting the number of agents that participate in the simulation model prior to the executing of the simulation model,
    wherein the adjusting of the number of the agents includes:
    grouping agents with similar characteristics to one agent according to a
    predetermined reference.

2. The method of claim 1, wherein the adjusting of the number of the agents includes:
    indicating density to the grouped agent.

3. The method of claim 1, further comprising:
    updating the predetermined error range in consideration of tendency and conditions of data.

4. The method of claim 1, wherein the generating of the model evolution strategy includes generating the model evolution strategy using at least one of change results between the real-data and the simulation resulting value, a simulation model structure, a change history, and the simulation resulting value.

5. A self-evolving agent-based simulation system comprising:
    a simulation model execution unit including a processor for executing an agent-based simulation model and outputting a simulation resulting value;
    a change recognition unit including a processor and a transmitter for checking a difference between real-data and the simulation resulting value;
    a model self-evolving unit for evolving the simulation model by applying the difference when the difference is outside a predetermined error range; and
    a simulation preparation processor for adjusting the number of agents that participate in the simulation model prior to execution of the simulation model,
    wherein the simulation preparation processor includes an agent grouping unit including a processor for grouping agents having similar characteristics to one agent according to a predetermined reference.

6. The self-evolving agent-based simulation system of claim 5, further comprising:
    a model evolution strategy generator includes a receiver for generating model evolution strategy based on the difference,
    wherein the model self-evolving unit reconstructs components of the simulation model based on the model evolution strategy.

7. The self-evolving agent-based simulation system of claim 5, wherein the change recognition unit includes:
    a complex domain data analyzer including a processor for converting the real-data into a form in which the real-data is comparable with the simulation resulting value;
    a change recognition processor for recognizing the difference between the real-data and the simulation resulting value at the same time; and
    a data tendency analyzer including a processor for generating a change recognition results according to the difference when the difference is outside the error range.

8. The self-evolving agent-based simulation system of claim 7, wherein the model self-evolving unit generates the model evolution strategy using at least one of the change recognition results, a simulation model structure, a change history, and the simulation resulting value.

9. The self-evolving agent-based simulation system of claim 5, wherein the simulation preparation processor includes indicating density to the grouped agents.

* * * * *